United States Patent [19]
Maziasz et al.

[11] Patent Number: 5,737,236
[45] Date of Patent: Apr. 7, 1998

[54] APPARATUS AND METHOD FOR THE AUTOMATIC DETERMINATION OF A STANDARD LIBRARY HEIGHT WITHIN AN INTEGRATED CIRCUIT DESIGN

[75] Inventors: Robert Maziasz; Mohankumar Guruswamy; Daniel W. Dulitz; David Blaauw; Larry Jones, all of Austin, Tex.

[73] Assignee: Motorola, Inc., Schaumburg, Ill.

[21] Appl. No.: 598,555

[22] Filed: Feb. 8, 1996

[51] Int. Cl.⁶ ..................................................... G06F 17/50
[52] U.S. Cl. ............................................ 364/490; 364/488
[58] Field of Search ....................................... 364/488, 487, 364/490, 491, 578

[56] References Cited

U.S. PATENT DOCUMENTS

| | | | |
|---|---|---|---|
| 5,187,668 | 2/1993 | Okude et al. | 364/468 |
| 5,394,338 | 2/1995 | Shinohara et al. | 364/491 |
| 5,416,720 | 5/1995 | Fukui | 364/489 |
| 5,513,119 | 4/1996 | Moore et al. | 364/491 |
| 5,587,923 | 12/1996 | Wang | 364/490 |
| 5,598,347 | 1/1997 | Iwasaki | 364/491 |

OTHER PUBLICATIONS

Fisher et al. "Optimization of Standard Cell Libraries for Low Power, High Speed, or Minimal Area Designs," IEEE 1996, pp. 493–496.

Gee et al., "A Custom Cell Generation System for Double-Metal CMOS Technology," IEEE 1989, pp. 140–143.

Reis et al., "An Efficient Design Methodology for Standard Cell Circuits", ISCAS '88, pp. 1213–1216.

Sechen et al., "ThunderBird: A Complete Standard Cell Layout Package," IEEE 1988, pp. 410–420.

Sechen et al., "TimberWolf 3.2: A New Standard Cell Placement and Global Routing Package", IEEE 1986, pp. 432–439.

Ramachandran et al., "SYMCELL—A Symbolic Standard Cell System", IEEE 1991, pp. 449–452.

Lin et al., "Delay and Area Optimization in Standard Cell Design", IEEE 1990, pp. 349–352.

Kurosawa et al., "Automation of User–Specific ASIC Library Development", IEEE 1991, pp. 14–7.1–14–7.2.

Chuang et al., "Timing and Area Optimization for Standard-Cell VLSI Design", IEEE 1995, pp. 308–320.

Chang et al., "Technology Issues of Library Porting in Multi–Process Environment", IEEE 1993, pp. 320–325.

Primary Examiner—Emanuel T. Voeltz
Assistant Examiner—Leigh Marie Garbowski

[57] ABSTRACT

The present invention relates to a method (100, 150, 200) and associated data processing system (250) for determining a standard cell height within an integrated circuit design. A plurality of cell types, each cell type including a plurality of cell structures are received (102). Then, weighting values are received, one for each cell type (104). Expected intercell connection densities are preferably also received. Various target cell heights are processed with the plurality of cell types, the weighting values, and the expected intercell connection densities to generate a standard cell height (106). The standard cell height used with the integrated circuit design produces an optimized integrated circuit area, preferably a minimum area. The present invention includes a method (200) and system (250) for selecting an optimized standard cell height that, when used with a place-and-route tool to generate a physical design file (204) produces an optimized physical integrated circuit design. A method of manufacture (300) is also included.

23 Claims, 6 Drawing Sheets

5,737,236

APPARATUS AND METHOD FOR THE AUTOMATIC DETERMINATION OF A STANDARD LIBRARY HEIGHT WITHIN AN INTEGRATED CIRCUIT DESIGN

TECHNICAL FIELD OF THE INVENTION

This invention relates generally to the design and manufacture of integrated circuitry and more particularly to an automated method and associated apparatus for selecting an optimized library height or standard cell height in an integrated circuit design using library cells.

BACKGROUND OF THE INVENTION

A common method of designing an integrated circuit (IC) in a semi-custom design requires that an integrated circuit designer first provide a library of computer stored circuit cells and a behavioral circuit model describing the functionality of the integrated circuit. FIG. 1 illustrates one method for generating a library of computer stored circuit cells and using the cells to build an integrated circuit based on the behavioral circuit. First, at step 10, the integrated circuit designer determines which particular cells are needed for the integrated circuit. These cells typically include fundamental logic gates such as OR, NAND, NOR, AND, XOR, inverter, and like logical cells with an array of logic gate sizes. Thus, the integrated circuit designer reviews, either manually or automatically, the behavioral circuit to identify the particular cells required.

Once the required logical cells are determined at step 10, the integrated circuit designer creates or retrieves a base logical cell structure for each cell type at step 12. Each base logical cell structure contains logical representations of transistors and other cell elements required to perform the particular logic functions of the cell. The base logical cell structure includes two-dimensional geometric data representing expected dimensions of the transistors and structures.

In the step 12, the IC designer also hand-lays out the cells determined in step 10 via a computer graphical interface to create physical cell structures. The integrated circuit designer determines physical placement of transistors and other cell elements within each logical cell structure and determines conductive routing between the transistors and elements to form the required logic gates. Once this placing is determined by the human IC designer, the IC designer uses the graphical interface to enter these human determined positions into a computer data base, this computer data base including two-dimensional representations of the physical cell structures created.

In step 12, the designer must place transistors and other components within each cell's physical structure such that the cell adheres to a library height constraint and operational constraints. A library height constraint generally refers to a maximum allowable height of cell structures for the particular integrated circuit design. Thus, the library height constraint is also often referred to as a standard cell height. Because, in further steps, cells will be assembled in rows to create an integrated circuit, the cells that are assembled in rows between power and ground rails must have equal cell heights. To meet the library height constraint, the IC designer often folds transistors within the base cell structure to create a cell structure having a shorter cell height to satisfy the library height constraint. The folding of transistors and other cell elements includes dividing the elements into at least two sections. In a CMOS design, for example, an unfolded transistor may be replaced by two or more smaller transistors that, connected correctly in combination, provide an equivalent current drive. When a transistor is replaced by the two or more smaller transistors, the transistor is considered to have been folded. With each of the folded transistor portions shorter than the unfolded transistor, the folded transistor portions may be arranged within the cell structure to create a cell structure having the shorter height but potentially greater width.

The designer, with experience, provides a rough estimation of a satisfactory cell layout and folding combination based on the library height constraint. However, the designer can evaluate only a few folding combinations within the cell structure. Therefore, the quality of the physical cell structure layout depends upon the IC designer's ability and the amount of time and effort the IC designer has to devote to the physical layout of the cell.

Because the library height constraint was determined prior to step 12, only a single library height constraint is evaluated. Because many thousands of cell structures typically are combined to create a custom integrated circuit, the library height constraint significantly impacts the area of the integrated circuit. An optimum library height will minimize the area of the integrated circuit. However, in step 12, the designer relies only upon experience to select the library height constraint. Therefore, if the height chosen in step 12 of FIG. 1 is not optimal, then the substrate surface area of the design will be larger than it needs to be resulting in greater chance for yield loss, fewer die per wafer, greater manufacturing expense, a slower product, speed path problems, and other problems associated with making an integrated circuit too large.

Horizontal and vertical intercell routing requirements of the integrated circuit design affect the area of the integrated circuit as well. While connections between cells required to implement the logic of the integrated circuit design preferably are routed over the cells, oftentimes additional routing area must be added between cells to accommodate intercell routing. The additional routing area between cells in a direction parallel to the rows of cells in the integrated circuit is typically called horizontal routing area. Likewise, the additional routing area between cells in a direction perpendicular to the rows of cells in the integrated circuit is typically called vertical routing area. Because the available horizontal routing area over cells increases with cell height and the vertical routing area over cells increases with cell width, the library height constraint affects the additional vertical and horizontal routing area that may be required for the integrated circuit design. The prior art method of FIG. 1 addresses intercell routing requirements solely upon designer experience to statically select a standard library height and therefore generally selects a non-optimized library height. If a height is not chosen properly, then the product will not be able to be routed efficiently and speed will suffer. In addition, subsequent derivative products will probably be slower, and the time-to-market may increase.

After the physical cell structures have been defined in step 12, step 14 verifies the logic of the physical cell structures defined by the IC designer in step 12. After the step 14, step 16 checks the hand-laid-out cells to determine if a plurality of design rules are adhered to. Design rules are provided to integrated circuit designers to ensure that a part can be manufactured with adequate yield. After step 16, step 18 is performed to extract parasitics from each of the library cells generated in steps 10–16. Parasitic quantities extracted include resistances, capacitances, impedances, inductance, and other like parameters which physically affect or are physically brought about by the cells designed in steps 10-16. In a step 20, the parameters extracted from step 18 along with the physical two dimensional layout of cells defined in steps 10-16 is used to characterize the cells for use in integrated circuit design. Once steps 10-20 have been performed, a library of unconnected cells having logical inputs and outputs have been adequately formed for use in integrated circuit design. The cells are used as building blocks which are pieced together into a larger interconnected cell-structure known as an integrated circuit.

Once a library is formed via steps 10-20, the library is used to design an integrated circuit from the cells defined. The human IC designer at step 22 presents a behavioral model which defines logically the operation of the integrated circuit. At step 24, a logic synthesis tool receives the behavioral circuit model and the library cells created in steps 10-20. The synthesis tool maps the instructions from the behavioral circuit model to one or more logic cells from the library to transform the behavioral circuit model to a gate schematic net list of interconnected cells.

At step 26, a place and route tool receives the gate schematic net list, accesses the library cells, and position the cells of the gate schematic net list in a two-dimensional format within an area of an integrated circuit die perimeter. The place and route step 26 is a physical design file which represents the integrated circuit with two-dimensional geometric data that indicates the physical arrangements of all cells within the gate schematic net list as well as the interconnections in the integrated circuit. Step 26 will include additional horizontal and vertical muting areas to satisfy the intercell routing requirements of the integrated circuit design.

Because only a single library height was selected in step 12, step 26 utilizes only cells that conform to the selected library height. Thus, step 26 must compensate for any shortcoming in the library height selection by adding additional routing areas. Because, the total area of the integrated circuit varies depending upon the library height, the prior art method could not optimize the area of the integrated circuit since the library height is fixed in step 12 and cannot be changed in step 26.

Thus, there exists a need in the art for an apparatus and associated method for determining an optimized library height for standard cells within a modular integrated circuit design using a library of cells.

DETAILED DESCRIPTION OF THE DRAWINGS

The present invention relates to a method and associated data processing system for selecting an optimized standard cell height within an integrated circuit design. In accordance with the present invention, various cell structures for each of a plurality of cell types are received, each cell structure having a differing height. Weighting values for the integrated circuit design are received wherein the weighting values determine a frequency of appearance of each of the plurality of cell types within the particular integrated circuit design. Further, expected intercell connection densities are received. These expected intercell connection densities indicate a density of both the vertical intercell routing and the horizontal intercell routing across the integrated circuit. In a preferred embodiment, the expected intercell connection densities include average horizontal and vertical routing requirements for the integrated circuit. Based upon the plurality of cell structures, the plurality of weighting values, and the expected intercell connection densities, a standard cell height is selected to optimize an area of the integrated circuit. Preferably, the standard cell height for the particular integrated circuit design is selected to minimize an area of the integrated circuit. The present invention can be better understood with reference to FIGS. 2-11 below.

Figure 1:
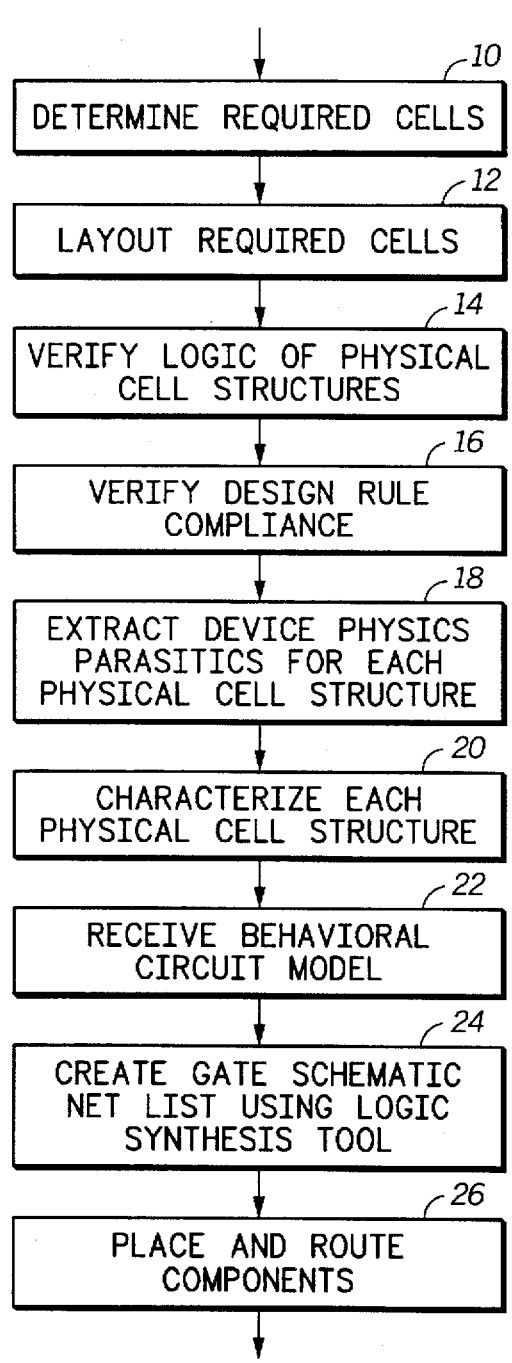
FIG. 1 is a flowchart illustrating a prior art method for designing an integrated circuit using a library cell approach.
Figure 2:
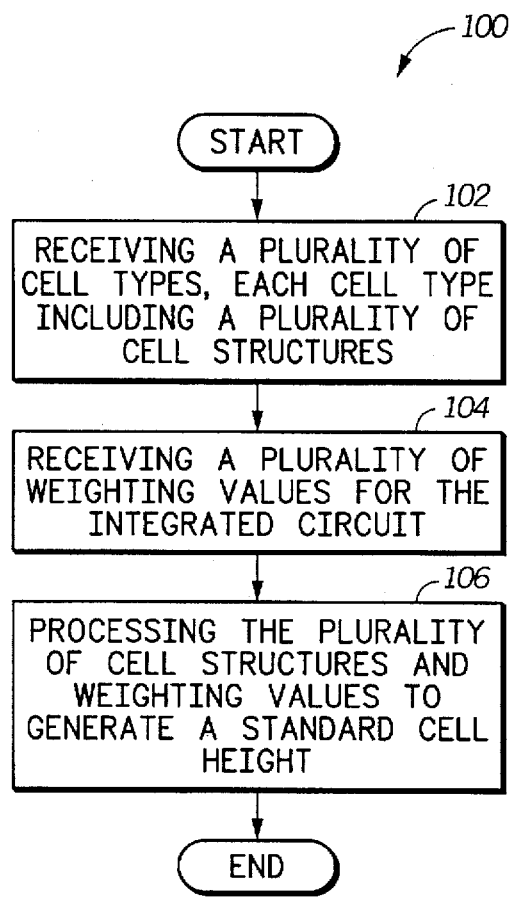
FIG. 2 is a flowchart illustrating a method for determining a standard cell height in an integrated circuit design in accordance with the present invention.

FIG. 2 illustrates a method 100 for determining a standard cell height in an integrated circuit design in accordance with the present invention. The method commences at step 102 by receiving a plurality of cell types. Each cell type within the plurality of cell types includes a plurality of cell structures. For example, a two-input NAND gate is a cell type while a three-input NAND gate is a different cell type. Therefore, in a typical situation, each of the cell structures for a given cell type has a different cell layout and a different intracell routing. The plurality of differing cell structures for a single cell type will typically include differing transistor folding combinations, different element placements within the cell structure, different element or transistor aspect ratios, and different routing between elements within the cell structure. Therefore, each particular cell structure for the cell type has an equivalent logical design but a unique physical layout. These particular cell structures may represent cell structures that have been logically placed and routed with associated estimated physical dimensions. The cell structures may also represent cell structures that have been physically placed and routed with actual cell dimensions for a particular manufacturing process that will be implemented to construct the integrated circuit. The cell structures may have been placed and muted by an integrated circuit designer or automatically placed and routed by a computer aided design (CAD) tool. In either case, the cell structures of a respective cell type differ from one another in their orientation of transistors and other elements within the cell.

Next, at step 104, the method 100 includes receiving a plurality of weighting values for the integrated circuit design. Each weighting value indicates an expected frequency of use of a respective cell type. For example, for a cell type that provides the XOR function, the weighting value for the integrated circuit design would indicate an expected proportional frequency of use of the XOR cell type within the integrated circuit design. One would expect that for most common integrated circuits, the XOR function would be less used than the inverter function or the NAND function and therefore have a lower weighting value. Of course, in differing integrated circuit designs, weighting values for the plurality of cell types differ. For example, in a more memory intensive integrated circuit design, memory elements would have higher weighting values than they would in less memory intensive integrated circuit designs that contain primarily logic gates with few or no memory elements.

Next, at step 106, the method 100 includes processing the plurality of cell structures and the plurality of weighting values to generate a standard cell height. One particular implementation of step 106 is to perform a multiplication function between the weighting values and the height and width of selected cell structures that correspond to the particular library cells. In this fashion, a total area number is produced for the whole integrated circuit or a whole circuit module of an integrated circuit. Such an operation, when repeated for a variety of cell heights, provides an indication of the total area that would be required for the integrated circuit for each particular standard cell height that is evaluated. In this fashion, an optimal or near-optimal standard cell height may be selected from a variety of available standard cell heights such that total substrate surface area is minimized. By minimizing substrate size, yield will improve, the speed of the integrated circuit (IC) will improve, speed paths become shorter, a number of die-per-wafer increases, manufacturing costs are reduced, etc..

The optimized area may not only comprise a minimum integrated circuit area but also an optimized shape as well. Certain applications and packaging requirements correspond to differing integrated circuit area geometries. For example, in certain applications, an elongated rectangular integrated circuit area may be desired for multi chip module (MCM) reasons or for other packaging reasons. In other applications a substantially square area may be desired. These geometries are often referred to as aspect ratios of the integrated circuit. The method 100 illustrated in FIG. 2 may be executed to optimize desired aspect ratios as well by providing the aspect ratio as a constraint to consider when selecting an optimal cell height.

Differing geometries of the integrated circuit area often provide varying operational characteristics. In certain types of integrated circuits that are substantially modular in design, it may be desirable to orient the modules with respect to one another to reduce connection lengths between the modules thereby increasing communication speed between modules. The method 100 of the present invention may be implemented to generate the particular orientations of modules as well as to minimize area. Therefore, speed considerations may also be addressed when determining an optimal cell height.

The method 100 preferably also includes the step of receiving expected intercell connection densities for the integrated circuit. The expected intercell connection densities for the integrated circuit are used in processing the plurality of structures to optimize the area of the integrated circuit. Because vertical intercell routing in the integrated circuit necessarily requires utilization of the area of at least one layer of the integrated circuit, the total integrated circuit must have a certain width to provide the required vertical intercell routing. Therefore, the density of conductive interconnections that are needed to pass vertically though the cells of the integrated circuit is needed to determine an optimal height that does not either cramp or overcompensate for vertical routing. At the same time, the integrated circuit area must have sufficient height to accommodate the required horizontal intercell routing for the integrated circuit design. A particular cell height provides a specific horizontal cell routing capability. Cell widths, which are dependent upon cell height, provide specific vertical cell routing capabilities. The integrated circuit design includes both vertical and horizontal intercell routing requirements represented in the expected intercell connection densities. The vertical and horizontal routing areas required to satisfy the expected intercell connection densities are dependent upon the standard cell height and the resulting cell widths. Thus, the expected intercell connection densities, both horizontal and vertical, must be considered in determining a standard cell height that optimizes an area of the integrated circuit.

Thus, the method 100 illustrated in FIG. 2 provides the important benefits of determining an optimum standard cell height that achieves an optimized area of an integrated circuit design before library cell heights are fixed to a specific height. Preferably, the method 100 is implemented in conjunction with a modular design using library cells to achieve an overall physical design that has a minimized area. By achieving the optimized area via an optimized library cell height, an operation of the integrated circuit will be enhanced, the power consumption characteristics of the integrated circuit design will be reduced, and the cost of the integrated circuit will be reduced. Further, since every possible library height can be evaluated employing the method 100 of the present invention, the method 100 guarantees that an optimized solution will be produced without relying on guess work and/or the "expertise" of designers.

Figure 3:
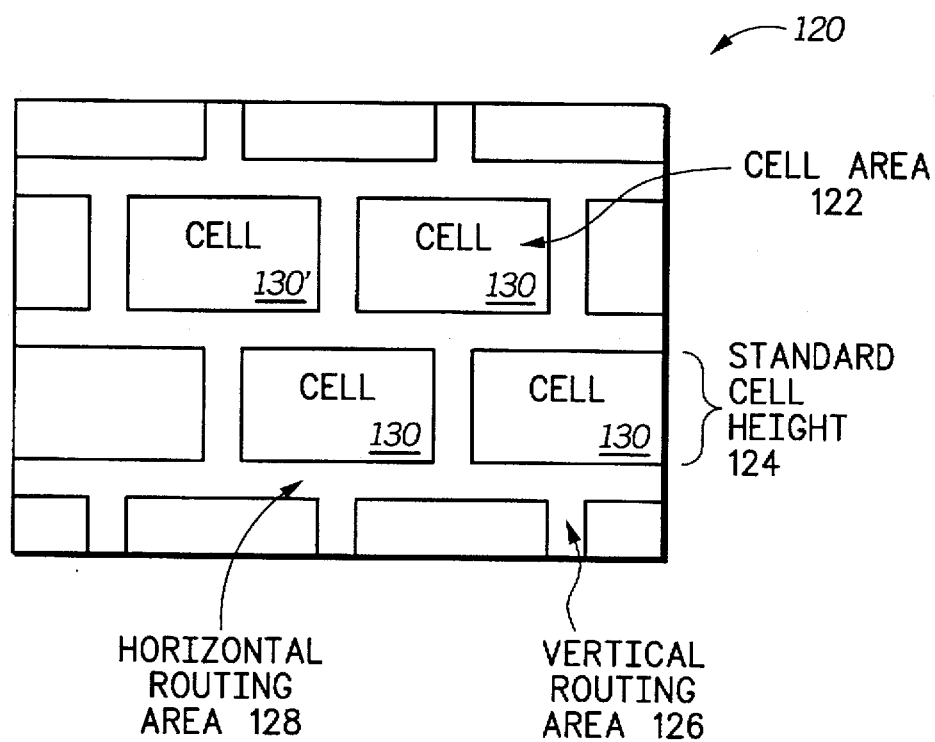
FIG. 3 is a block diagram illustrating a cell and routing structure within an integrated circuit design in accordance with the present invention.

FIG. 3 illustrates a section 120 of an integrated circuit that has been arranged in accordance with the method of the present invention. Within the integrated circuit section 120 are a plurality of cells 130 arranged in rows across the integrated circuit. Each cell 130 has a height corresponding to the optimal or near-optimal standard cell height, a cell width, and a cell area 122 which is the height multiplied by the width. The cell width and cell area 122 of the cells 130 is a function of the particular cell structure height chosen optimally via FIG. 2. Elements (e.g. transistors) must be rearranged within the cell 130 when the height is changed and such rearranging as the height is changed alters the width of the cells 130 in a nonlinear manner. It is possible, given that the transistors within the cell are also of fixed geometric constraints, that decreasing the height may actually increase the width so much that overall area increases. It may also be true that increasing the height actually reduces the total area since the increase in height is offset by a larger loss in width. The affect of cell height changes to cell width are non-linear and depend upon the geometries of the transistors and transistor folding techniques contained within the cell 130. Also, a cell that has twenty transistors will have the same height as a cell that has six transistors. If the twenty transistors and the six transistors are of a same size and both cells have the same height, it must be that the cells differ in width. Therefore, while each of the cells 130 within an integrated circuit design 120 have a common cell height 120, adjacent cells within the integrated circuit design 120 typically have differing widths if they perform different logical functions, have different sized transistors, or have a different number of transistors.

Horizontal routing area 128 and vertical routing area 126 within the integrated circuit provide additional paths for routing intercell connections within the integrated circuit. The horizontal routing area 128 is an area between cells 130 that is required to provide intercell routes that run horizontally across the integrated circuit 120 parallel to rows of cells. The vertical routing area 126 is the area that is provided to accommodate vertical intercell routes in the integrated circuit 120 perpendicular to rows of cells. While many intercell routes may pass over the cells 130, additional routing paths may be required to achieve the total intercell routings for the integrated circuit designs.

When a cell 130 is shorter and wider, it provides less horizontal routing capability over itself but more vertical routing capability. When the cell 130 is taller and narrower, it provides more horizontal routing area over itself but less vertical routing area over itself. Thus, the library height constraint determines the horizontal routing area 128 and vertical routing area 126 that must be added to the integrated circuit to provide intercell routes. The routing areas 126 and 128 represent additional area of the integrated circuit and the height should be chosen to reduce the total integrated circuit area. Thus, only by considering the cell area 122, the horizontal routing area 128, and the vertical routing area 126 in combination can the area of the integrated circuit be optimized effectively.

Figure 4:
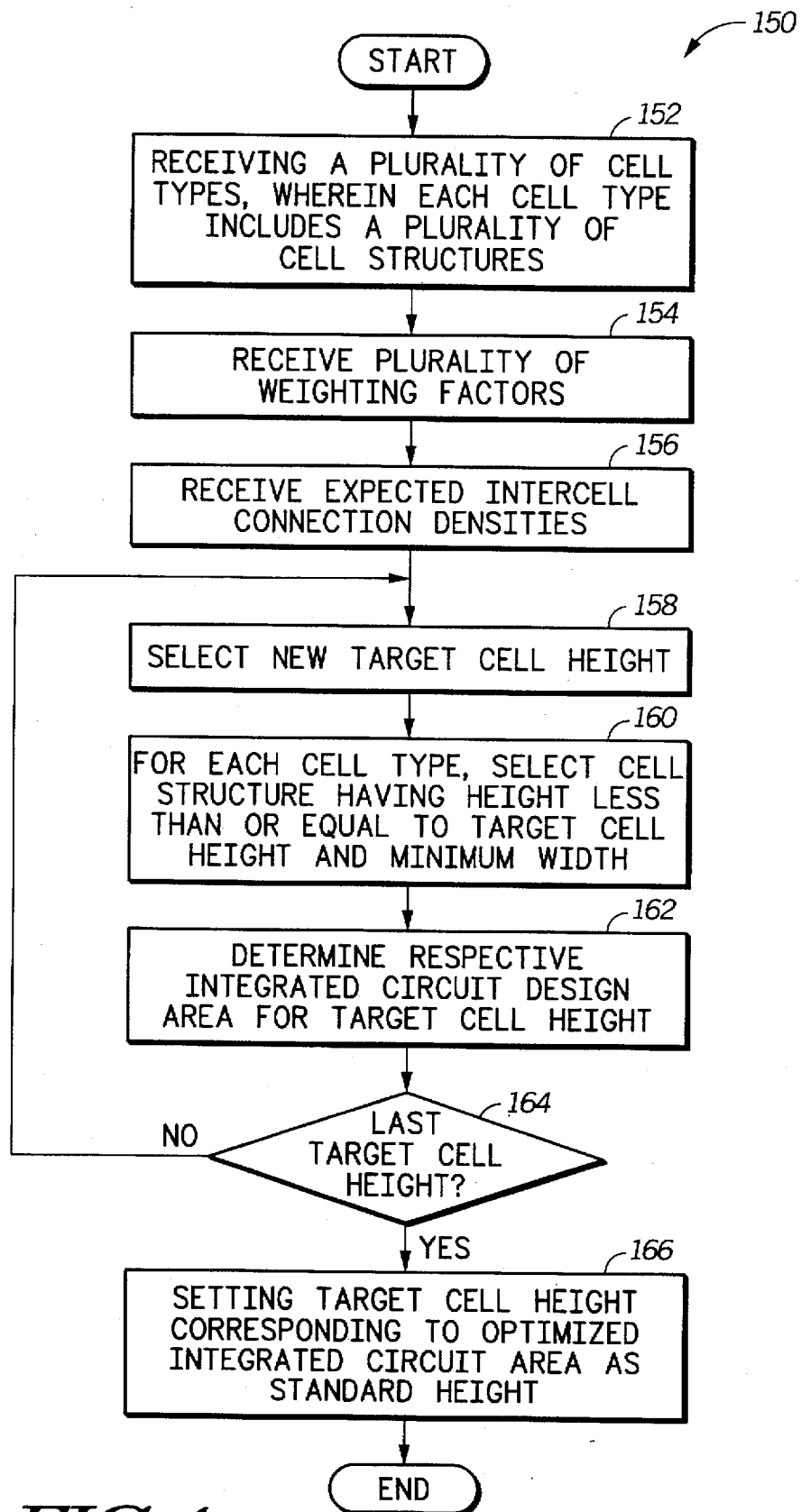
FIG. 4 is a flowchart illustrating a method for selecting an optimized standard cell height within an integrated circuit design in accordance with the present invention.

FIG. 4 illustrates a method 150 for selecting an optimized standard cell height within an integrated circuit design. The method commences at step 152 of receiving a plurality of cell types. Each cell type (e.g., AND, NOR, inverter, flip-flop, etc.) within the plurality of cell types includes a plurality of cell structures. As was previously discussed, each of the plurality of cell structures has a differing construction, either a logical construction or physical construction (different element placement, etc.). Each of the plurality of cell structures generally also has a differing height. For example, a 2-input NAND gate may be provided in twelve different cell heights varying from relatively short to relatively tall. However, two or more of the plurality of cell structures for a particular cell type may have a substantially similar cell height but a differing organization of elements (e.g., transistors) within the cell structure.

Next, at step 154, the method includes receiving a plurality of weighting values for the integrated circuit design. Each weighting value indicates a relative frequency of use of a respective cell type for a particular integrated circuit design. Thus, differing integrated circuit designs have differing weighting values for the particular cell types. Common logic gates used thousands of times in a single IC, like NAND gates, inverters, and NOR gates, will have high weights in most designs whereas gates used only tens or hundred of times on the IC, like transmission gates, XOR gates, custom logic gates, output buffers, and the like, will have low weights. Next, at step 156, the method includes receiving expected intercell connection densities for the integrated circuit design. The intercell connection densities describe generally the requirements for connections that must be made between cells within the integrated circuit. Preferably, there will be expected intercell connection densities relating to the horizontal direction within an integrated circuit design and expected intercell connection densities relating to the vertical direction within the integrated circuit design. Each of these expected intercell connection densities will affect the determination of an optimum standard cell height. The values in step 156 are typically fixed within a tight range for specific technologies. For example, horizontal and vertical routing are typically similar among SRAM memory designs and likewise are similar among superscalar processor ICs. If the initial values are grossly inaccurate in step 156 (an event that is unlikely), the numbers of step 156 can be changed after final step 166 and the algorithm of FIG. 4 can be repeated once again with improved connection densities in step 156.

At step 158, the method 150 includes selecting a new target cell height. On a first iteration of step 158, an initial target cell height is selected. Preferably, the initial target cell height is a maximum target cell height allowed for the particular library or particular integrated circuit. Preferably, the various target cell heights selected in step 158 are based upon actual heights of the plurality of cell structures. Each particular cell structure of the plurality of cell structures for the plurality of cell types will have a particular height. By establishing a list of each cell structure height among all of the plurality of cell structures, a complete list of possible heights to be selected as a target cell height are determined. A subset of these may be used to minimize the number of iterations of the method 150 of FIG. 4. However, to be completely thorough in determining an optimized standard cell height, each particular cell height in the list should be evaluated. For example, if all possible cell heights in the library are cells having a height of one of either 60 microns, 50 microns, 42 microns, 32 microns, 25 microns, 17.5 microns, 12.5 microns, and 7.5 microns, the step 158 will begin a first loop by choosing the 60 micron "tallest cell" in the library as the first target height.

Next, at step 160, the method 150 includes, for each cell type, selecting a cell structure having a height equal to or less than (but closest to) the target cell height selected in step 158. The cell selected for each cell type will be the cell having the smallest width. Thus, for the particular target cell height, only one cell structure will be selected for each cell type from the plurality of cell types and the plurality of cell structures. If two cell structures of a particular cell type have a substantially equal height, the cell structure having the minimum width will be selected to minimize area for that cell. Step 160 may include stretching the height of a cell structure so that the height of the cell structure corresponds to the target cell height. For example, for a particular cell type, there may be no cell structure coinciding exactly with the target cell height of 60 microns. In this situation, the height of a cell structure having a height slightly less than the target cell height (like 50 microns or so) will be selected and stretched to equal the target cell height of 60 microns. Therefore, the loop of steps 158 through 164 may be executed using increments of height according to the height resident in the library or may be heights arbitrarily chosen that do not correspond to actual heights of cells in the library.

Further in step 160, a particular cell structure for the corresponding cell type may be stretched to equalize the height of its transistor regions so that it is equalized with adjacent cell structure transistor regions. Oftentimes, adjacent cell structures will have dissimilar shaped P-type transistor active area regions and N-type transistor active area regions, or N-well regions and P-well regions of adjacent cells will not align. In a typical integrated circuit design, a P-doped substrate will be employed and an N-well will be formed within the substrate in which P-type transistors are fabricated. In this situation, the well structure for the P-type transistors is N-doped. N-doped wells of adjacent cells may be very closely spaced if they include transistors having substantially identical heights (i.e., the N wells are not grossly misaligned). When wells are misaligned at adjacent cells, the misaligned well regions may cause design rule violations or short circuiting which is not desired, or may result in increasing the IC surface area. In this misalignment situation, it is desirable to equalize the height of the adjacent N-well structures in adjacent cells to save area in some instances. By equalizing the well heights, adjacent cell structures may be disposed in a common well so that spacing between the adjacent wells is minimized. Further, other transistor regions within the adjacent cells may also be equalized in height to minimize spacing between the adjacent cells.

Next, at step 162, the method includes determining an integrated circuit design area. This step is performed based upon the selected cell structures, the selected target cell height, the plurality of weighting values for the integrated circuit design, and the expected intercell connection densities for the integrated circuit design. Based upon these components, an expected total cell area may be determined from the selected cell structures and the plurality of weighting values. Then, based upon the target cell height, the total width of the cells selected, the weighting values, and the expected intercell connection densities, the vertical routing area and the horizontal routing area required for the integrated circuit design may be determined. The total area of the integrated circuit for the target cell height may then be determined based upon the total cell area, the required horizontal routing area, and the required area of the vertical routing area.

Next, at step 164, the method 150 determines whether the last target cell height has been selected. The last target cell height preferably corresponds to a lower target cell height limit input by the circuit designer or determined based upon the cell structures. If, in step 164, it is determined that the last target cell height has not been determined, the method returns to step 158 where a new target cell height is selected. In accordance with the preferred embodiment previously described, the next lower target cell height will be selected in step 158. Using the example heights given above, the method would execute several iterations of the loop progressing from 60 microns in height down to 7.5 microns in height finding the estimated IC surface area for each target height using the weighting values, etc..

If, at step 164, however, the last target cell height has been evaluated in accordance with the steps 160 and 162, the method proceeds to step 166. Step 166 includes comparing all of the areas determined in the iterations of steps 158–164. The height which resulted in the minimal IC substrate area calculation in the iterations of steps 158-164 is determined. The target cell height corresponding to the optimized cell height of the integrated circuit area is determined to be the standard height and is then used for the integrated circuit standard cell library. Thus, the method 150 has determined the standard cell height to be used in the particular integrated circuit design that will minimize the integrated circuit area.

Thus, the method 150 illustrated in FIG. 4 provides the important benefit of determining a standard cell height that will produce an integrated circuit design having an optimized area. While the method 150 preferably selects a standard cell height having a minimized area, the method 150 may also be employed to select a standard cell height that produces particular aspect ratios, particular cell geometries, or various other optimized structures.

Figure 5:
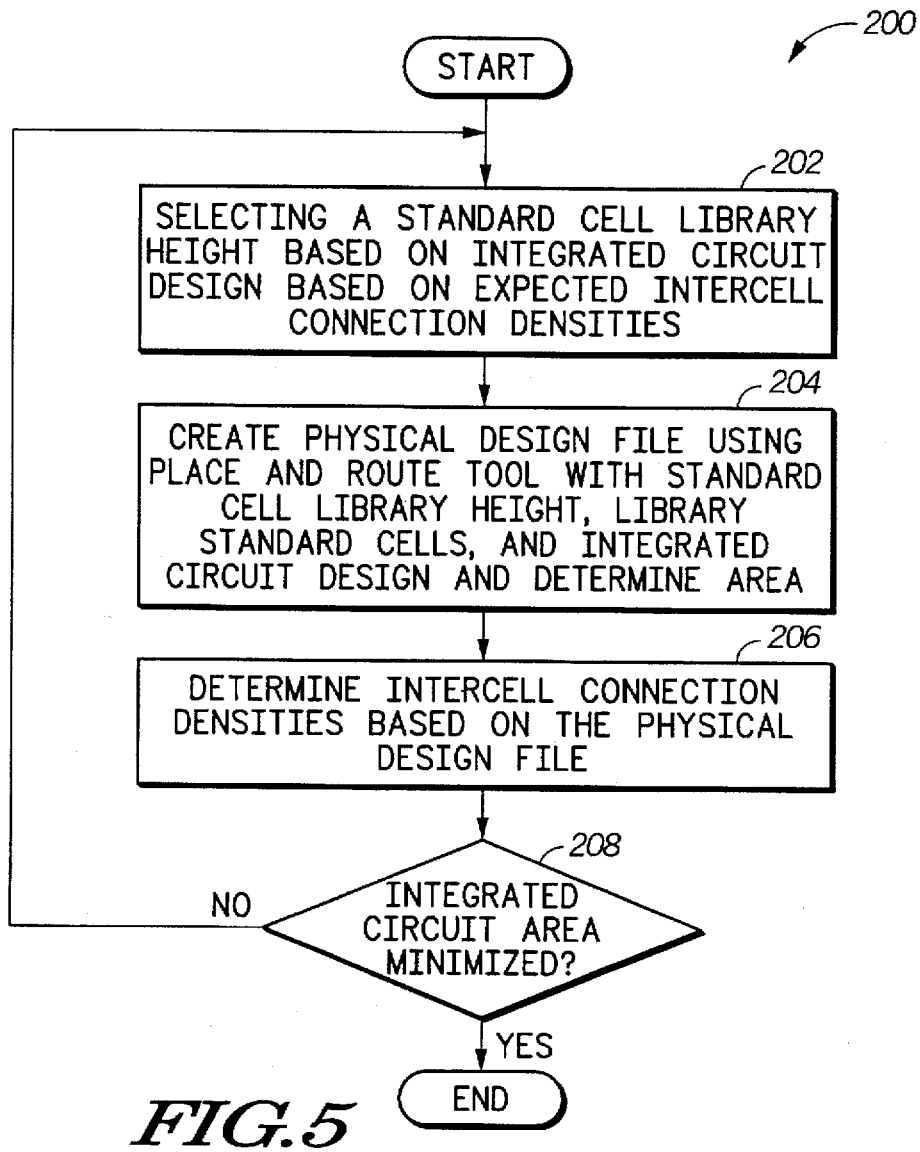
FIG. 5 is a flowchart illustrating a method for minimizing an area of an integrated circuit based on an integrated circuit design.

FIG. 5 illustrates a method 200 for minimizing an area of an integrated circuit based on an integrated circuit design and a standard cell library. The method 200 commences at step 202 of selecting a standard cell library height based on an integrated circuit design and expected intercell connection densities within the integrated circuit design. Step 202 may be accomplished with either the method 100 of FIG. 2, the method 150 of FIG. 4, or by other methods in accordance with the teachings of the present invention, or by any other method.

Next, at step 204, the method 200 includes creating a physical design file using a place-and-route tool in conjunction with the standard cell library height of the integrated circuit design determined in step 202. The place-and-route tool selects cell structures from the library that correspond to the standard cell library height. The physical design file generated in step 204 includes physical placement locations of circuit elements with the integrated circuit as well as physical routings of the intercell connections between the standard cells. Thus, step 204 physically lays out cells to accomplish the integrated circuit design and routes the interconnections between the cells within the integrated circuit design. Step 204 also includes determining an area of the integrated circuit design based upon the physical design file.

Next, at step 206, the method 200 includes determining intercell connection densities based upon the physical design file. Because all of the interconnections between the cells have been routed in step 204, step 206 determines exact intercell connection densities for the integrated circuit design.

Next, at step 208, the method includes determining whether the integrated circuit area is minimized with respect to a previously determined integrated circuit area. Because a first execution of step 208 has no basis for comparison, on a first iteration through step 208, the decision step yields "no" as a result and the method proceeds to step 202. However, in subsequent executions of step 208, a previous integrated circuit area will be compared to an integrated circuit area calculated in step 204 for the current iteration. Then, if a difference between the previous integrated circuit area is no more than a fixed differential between the current calculated integrated circuit area, it is determined that the integrated circuit area has been minimized.

Upon a second execution of step 202, the actual intercell connection densities calculated in step 206 will be assigned as the expected intercell connection densities for the subsequent execution of step 204. Then, steps 202, 204, and 206 will be determined based upon the new intercell connection densities. Because on each iteration of the method 200 of FIG. 5, a more accurate determination of the expected intercell connection densities is used in step 202, the selection of a standard cell library height will more accurately represent an optimized height that will minimize the area of the integrated circuit.

Finally, when the difference between the integrated circuit area determined in a previous iteration and the area determined in the present iteration is no greater than a fixed tolerance, it will be determined that the integrated circuit area has been minimized. From this determination, the method ends. When such a determination has occurred, the library height selected in the prior iteration of the method 200 is equal to the library height selected in the current iteration of the method 200.

Basically, FIG. 5 utilizes FIG. 4 or FIG. 2 via a step 202, places and routes the circuit in step 204, calculates actual connection densities from the file created in step 204, and reruns steps 202–206 until the connection densities are within a tolerance or do not significantly change between iterations. In essence, FIG. 5 optimizes the method of FIG. 4 by adding an additional loop to steps 156–166 which continually corrects the connection densities for each pass until minimal area is achieved for the exact connection densities.

The method 200 of FIG. 5 determines an actual optimized integrated circuit area that includes the physical placement and routing of cells within the integrated circuit. In this fashion, uncertainty relating to expected intercell connection densities is removed and a more accurate determination is made as to what the standard cell library height should be used to minimize the area of an integrated circuit design.

Thus, the method 200 of FIG. 5 provides the important benefit of further reducing uncertainties relating to estimated parameters within the determination of the standard cell library height.

Figure 6:
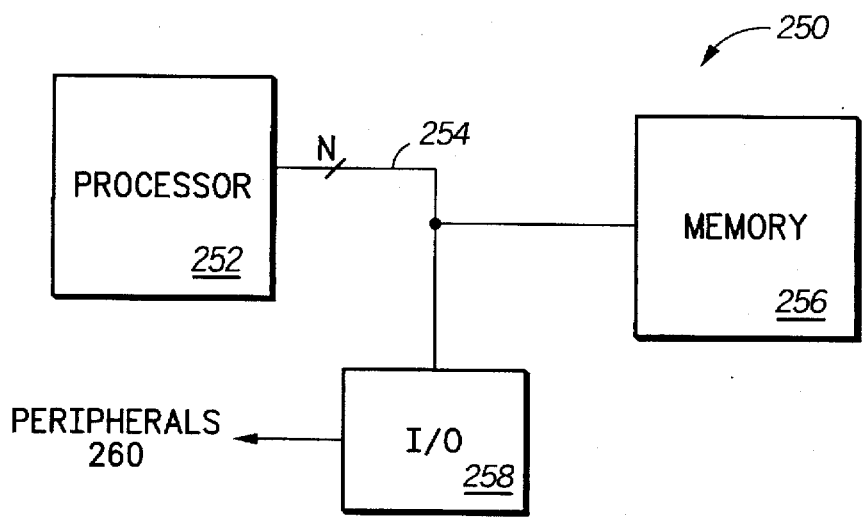
FIG. 6 is a block diagram illustrating a data processing system in accordance with the present invention.

FIG. 6 illustrates a data processing system 250 in accordance with the present invention. The data processing system 250 may be used to implement method 100, method 150, and method 200 illustrated in FIG. 2, FIG. 3, and FIG. 5, respectively or other embodiments of the present invention. As is known in the art, a data processing system 250, such as the one shown in FIG. 6 may be used to implement digitally encoded computer programs. Thus, with the methods of the present invention embodied as digital computer programs, the data processing system executes the methods. The data processing system 250 comprises a processor 252, processor bus 254, and memory 256. The data processing system 250 preferably also includes an input/output port 258 for communicating with peripheral devices 260, such as monitors, store devices, keyboards and other communication devices.

The processor 252 preferably comprises a type that is known in the art that is capable of processing digital instructions to operate upon digital data to implement the goals of a computer program. The processor bus 254 preferably has sufficient data width, addressing width, and control capabilities to allow the processor 252 to communicate with the memory 256, the input/output port 258 and the peripherals 256 through the input/output port 258.

Memory 256 preferably is a type known in the art capable of storing digital information, such digital information including digital instruction within a computer program and data that is operated upon by the processor 252 in conjunction with the computer program. The memory 256 preferably includes instructions for determining a standard cell height in an integrated circuit design. These instructions preferably include receiving a plurality of cell types wherein each cell type within the plurality of cell types includes a plurality of cell structures. Further instructions preferably include receiving a plurality of weighting values for the integrated circuit design. Each of the weighting values indicate a frequency of use in respect to cell type. Memory 256 preferably further includes storing instructions for processing plurality of cell structures, the plurality of weighting values to generate a standard cell height. Based on a standard cell height, the integrated circuit is optimized. Thus, the data processing system 250 of the present invention is capable of implementing the teachings of the present invention in a fashion that is useful to users that will reap benefits from the execution of the method of the present invention. In one form, processor 252 may be a PowerPC™ 601 processor as discussed in the PowerPC™601 RISC Processor User's Manual, Rev. 1, 1993, available from Motorola. In one form, the memory 256 may be any DRAM, SRAM, or like memory, such as the a MCM72MS32 or a MCM72MS64 available from Motorola.

Figure 7:
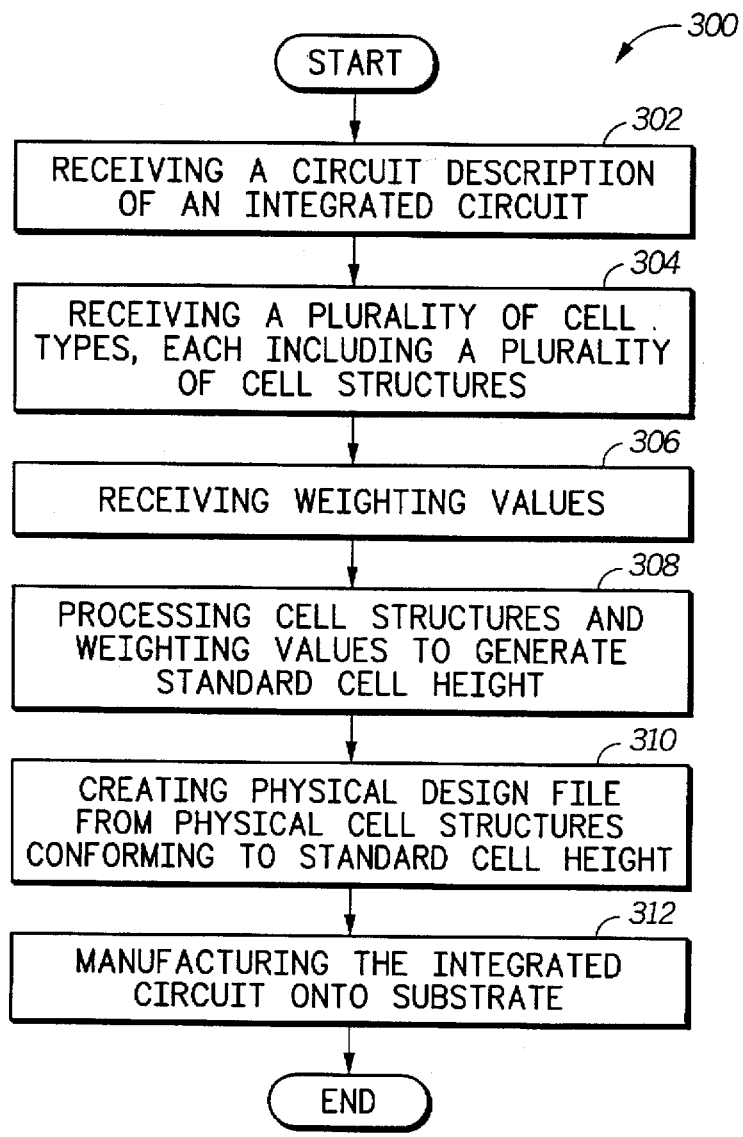
FIG. 7 is a flowchart illustrating a method of making an integrated circuit in accordance with the present invention.

FIG. 7 illustrates a method 300 for making an integrated circuit in accordance with the present invention. The method 300 commences at step 302 of receiving a circuit description of an integrated circuit design. The circuit description includes logic functions that may be performed by a plurality of logical cell structures. Preferably, the logical cells structures are of types previously described that perform logical functions and that may be constructed in various manners to perform the logical functions.

Next, at step 304, the method 300 includes receiving a plurality of cell types, wherein each cell type within the plurality of cell types includes a plurality of cell structures. Each cell type preferably performs a particular logical function such as OR, AND, XOR, NAND, NOR, or another logical function. For each cell type, then, each cell structure performs the logical function but has a unique construction. Preferably, each cell structure comprises a particular physical construction of the cell type. For example, each cell structure may include a particular folding combination of the elements within the cell. Thus, each particular cell structure, with its own folding combination, may have a unique height and width.

Next, at step 306, the method 300 includes receiving weighting values. These weighting values describe a frequency of use for each of the cell types received in step 304. For example, for a particular integrated circuit, a certain cell structure may appear more frequently than any other and therefore has a greater weighting value. Thus, each cell type will have a unique weighting value relating to its frequency of appearance in the integrated circuit design.

Then, at step 308, the method 300 includes processing the plurality of cell structures and the plurality of weighting values to generate a standard cell height, wherein based on the standard cell height, an area of the integrated circuit is optimized. Preferably, step 308 is accomplished in accordance with method steps previously described with reference to the FIGS. 2, 4, and 5. Thus, the step 308 is not described more particularly with respect to FIG. 7 since step 308 is simply a process described in detail by one or more of FIGS. 2, 4, and 5.

Next, step 310 includes creating a physical design file using a place and route tool in conjunction with a plurality of physical cell structures from a standard cell library conforming to the standard cell library height and the integrated circuit design. The place and route tool arranges the physical cell structures into a two-dimensional substrate area to form a physical design file of an integrated circuit die. Finally, step 312 includes manufacturing the integrated circuit die onto one or more physical substrates. Various integrated circuit fabrication techniques are outlined in Silicon Processing for the VLSI Era, Vol. 1, by Wolf and Tauber, copyright 1986, published by Lattice Press.

The method 300 of FIG. 7 therefore constructs an integrated circuit die or a plurality of IC die on a semiconductor wafer wherein each IC die has an optimized area. In a preferred embodiment, the integrated circuit die will have a minimized area allowing for higher production volume in manufacture that overall results in a reduced cost per die.

Figure 8:
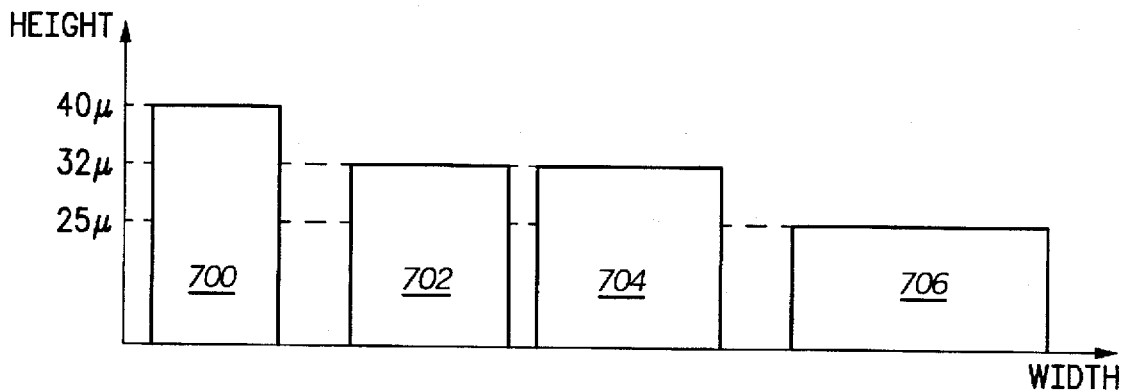
FIGS. 8-11 illustrates, m block diagrams, examples of optimal cell height selection using the method of FIG. 4 in accordance with the present invention

FIGS. 8–11 illustrate a simplified example of the method taught in FIG. 4. FIG. 8 illustrates four library cells labeled as cells 700, 702, 704, and 706. The cells illustrated in FIG. 8 are all of the same cell type. For example, each of the cells 700-706 may be a three input NAND gate having a same drive strength. The library will literally contain hundreds or thousands of standard cells of different cell types and different drive strengths and differing cell heights. Therefore, FIG. 8 illustrates only a small portion of the total cell library.

FIG. 8 illustrates that the cell 700 has a height of 40 microns. The cells 702 and 704 have a cell height of 32 microns. However, the internal layouts of the cells 702 and 704, while being equivalent in cell type, have a different internal arrangement which results in the cell 704 being slightly wider than the cell 702. FIG. 8 illustrates that cell 706 is 25 microns in height.

Figure 9:
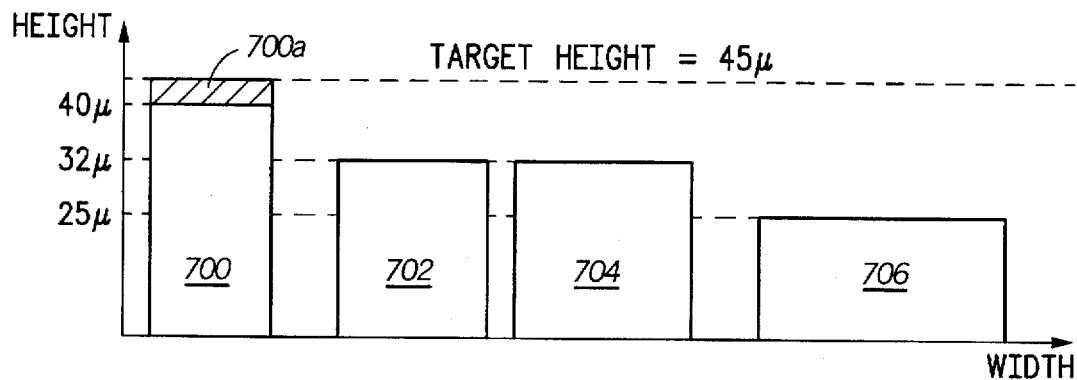

In FIG. 9, a first loop through the method of FIG. 4 selects a maximal target height, which in FIG. 9 is illustrated as 45 microns. The algorithm then selects for each cell type the cell equal to or less than the target height, but closest to the target height. Therefore, for the cell type illustrated in FIG. 9, the cell 700 is selected as being the cell closest to the target height of 45 microns. Since the cell 700 is 40 microns in height and the target height is 45 microns in height, the cell 700 must be stretched by a 5 micron stretch region referred to as region 700a so that all cells in the library conform to the target height of 45 microns for this pass through the loop of FIG. 4. Therefore, every cell type and every drive strength within the library will have a selected gate that may need to be stretched by a certain portion so that all of the selected cells for each cell type are now at a target height of 45 microns. Using this cell height and the width of all of the selected cells for all of the cell types, a multiplication is performed given the frequency of use of each cell type to determine a surface area of the overall integrated circuit. This surface area is stored corresponding to the height of 45 microns as indicated in FIG. 9.

Figure 10:
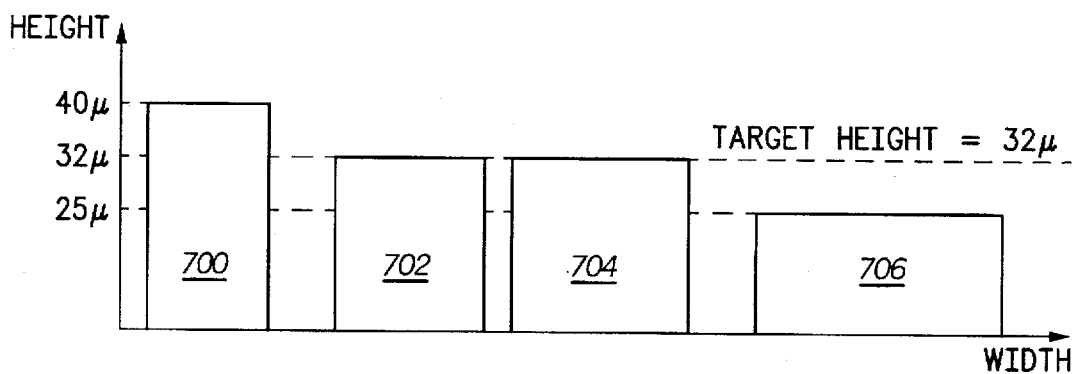

FIG. 10 then illustrates that a second pass through FIG. 4 is performed at a target cell height of 32 microns. At this height, both ceils 702 and 704 are the closest cells to the target height and one of these cells will be chosen as the selected cell. The algorithm will choose the cell having the minimum surface area and will therefore choose the cell having the minimal width, which is cell 702. This cell need not be stretched as indicated in FIG. 9 since the actual height of the cell 702 is equal to the target height 32 microns. The multiplication is then performed on all cell type selected ceils at the height of 32 microns to determine an overall integrated circuit surface area. This area is then stored in memory for later comparison.

Figure 11:
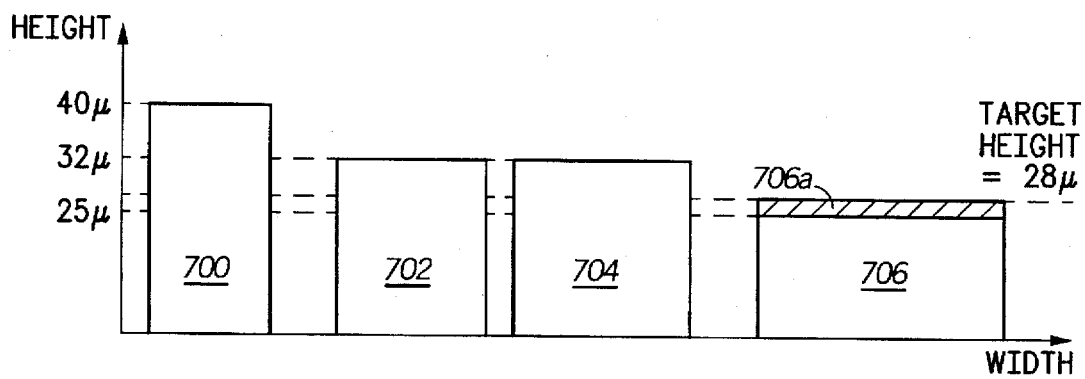

FIG. 11 illustrates that a third target height in the loop through FIG. 4 is set at 28 microns. At 28 microns, the cell which is selected is cell 706. Since cell 706 is actually at a height of 25 microns, a 3 micron stretch area 706a is needed to conform the cell 706 to the target height of 28 microns. Each cell type within the integrated circuit library is selected and conformed to the target height of 28 microns. The multiplication of the frequency of use and the area of the cells are then made to determine an overall surface area of the integrated circuit. This overall surface area associated with a cell height of 28 microns is then stored in memory.

After storing in memory a plurality of integrated circuit surface areas corresponding to a plurality of cell library height, the surface areas are compared and a minimum surface area is selected. The target height corresponding to this minimum surface area is then selected as the optimal library standard cell height for the integrated circuit design. It is important to note that it is also taught herein in the various flow charts that the interconnection densities initially input into the algorithm can also be optimized in a looping fashion to provide an even further optimized standard cell height.

The present invention preferably also includes computer readable media. Such computer readable media may be used within a peripheral of a data processing system 250 to read instructions to memory 256 such that the processor 252 may execute the instructions. Such instructions stored in the computer readable medium will include instructions that are consistent with the methods of the present invention. In this fashion, data processing systems executing the instructions stored on the computer readable medium will execute the method of the present invention to reap the benefits of the execution of such method steps.

The above described preferred embodiments are intended to illustrate the principles of the invention, but not to limit the scope of the invention. Plurality as used herein is intended to mean any value between two and infinity and should not be limited to any specific sub-range or constant. Various other embodiments and modifications to these preferred embodiments may be made by those skilled in the art without departing from the scope of the following claims.

We claim:

1. A method for determining a standard cell height in an integrated circuit design, the method comprising the steps of:

(a) receiving a plurality of cell types, wherein each cell type within the plurality of cell types includes a plurality of cell structures;

(b) receiving a plurality of weighting values for the integrated circuit design, wherein each weighting value indicates a frequency of use of a respective cell type in the integrated circuit design; and (c) iteratively processing through different cell heights while making calculations using two-dimensional areas of the plurality of cell structures and the plurality of weighting values to determine the standard cell height, wherein based on the standard cell height, an area of the integrated circuit design is optimized.

2. The method of claim 1, further comprising the step of:

(d) receiving expected intercell connection densities for the integrated circuit design, wherein the expected intercell connection densities are used in processing the plurality of structures to optimize the area of the integrated circuit design.

3. The method of claim 2, wherein the expected intercell connection densities include expected horizontal intercell connection densities and expected vertical intercell connection densities, and wherein the step of processing includes the steps of:

determining a cell height and horizontal routing area that together satisfy the expected horizontal intercell connection densities; and determining a cell width and vertical routing area that together satisfy the expected vertical intercell connection densities, wherein the area of the integrated circuit design is minimized.

4. The method of claim 1, further comprising the step of:

stretching a height of at least one cell structure in the integrated circuit design to coincide with the standard cell height.

5. The method of claim 1, further comprising the step of:

stretching a height of at least one cell structure in the integrated circuit design to equalize heights of an adjacent cell structure transistor regipn.

6. The method of claim 1 further comprising the steps of:

(d) storing the integrated circuit design in a computer data file; and (e) manufacturing a plurality of integrated circuits in accordance with the integrated circuit design stored in the computer data file.

7. A method for selecting an optimized standard cell height within an integrated circuit design, the method comprising the steps of:

(a) receiving a plurality of cell types, wherein each cell type within the plurality of cell types includes a plurality of cell structures;

(b) receiving a plurality of weighting values for the integrated circuit design, wherein each weighting value indicates a frequency of use of a respective cell type within the integrated circuit design;

(c) selecting a target cell height;

(d) for each cell type, selecting a cell structure having both a cell height equal to or less than the target cell height and a smallest width at the cell height;

(e) determining a respective integrated circuit design area based on selected cell structures from step (d) and the plurality of weighting values from step (b); and repeating steps (c) through (e) for differing target cell heights to determine a cell height that produces an optimized integrated circuit design area.

8. The method of claim 7, further comprising the step of:

(g) receiving expected intercell connection densities for the integrated circuit design, wherein the expected intercell connection densities are used in determining the respective integrated circuit design area.

9. The method of claim 8, wherein the expected intercell connection densities include expected horizontal intercell connection densities and expected vertical intercell connection densities, and wherein the step of determining the respective integrated circuit design area includes the steps of:

determining a horizontal routing area that, in conjunction with the target cell height, satisfies the expected horizontal intercell connection densities; and determining a vertical routing area that, in conjunction with selected cell structure widths, satisfies the expected vertical intercell connection densities.

10. The method of claim 7, wherein the step of selecting a cell structure having a height equal to or less than the target cell height and a minimum width further includes:

stretching the height of the cell structure to coincide with the target cell height.

11. The method of claim 7, wherein the step of selecting a cell structure having a height equal to or less than the target cell height and a minimum width further includes:

stretching the height of at least one cell structure to equalize heights of an adjacent cell structure transistor region.

12. The method of claim 7 further comprising the steps of:

(g) storing the integrated circuit design in a computer data file; and (h) manufacturing a plurality of integrated circuits in accordance with the integrated circuit design stored in the computer data file.

13. A method for minimizing an area of an integrated circuit based on an integrated circuit design, the method comprising the steps of:

(a) selecting a standard cell library height based on the integrated circuit design and expected intercell connection densities, wherein the standard cell library height satisfies cell routing requirements;

(b) creating a physical design file using a place and route tool in accordance with the standard cell library height and the integrated circuit design, wherein the physical design file includes physical placement of circuit elements and interconnections between standard cells;

(c) determining new expected intercell connection densities based upon the physical design file to replace the expected intercell connection densities used is step (a); and (d) repeating steps (a) through (c) until the area of the integrated circuit is minimized by optimizing the expected intercell connection densities via step (c) and optimizing the standard library height in step (a).

14. The method of claim 13, wherein the step of selecting a standard cell library height includes the steps of:

receiving a plurality of cell types, wherein each cell type within the plurality of cell types includes a plurality of cell structures;

receiving a plurality of weighting values for the integrated circuit design, wherein each weighting value indicates a frequency of use of a respective cell type; and processing the plurality of cell structures, the plurality of weighting values, and the expected intercell connection densities to generate the standard cell library height, wherein based on the standard cell library height, an area of the integrated circuit is optimized.

15. The method of claim 13, further comprising the step of:

(e) receiving expected intercell connection densities for the integrated circuit, wherein the expected intercell connection densities are used in processing the plurality of structures to optimize the area of the integrated circuit.

16. The method of claim 13 further comprising the steps of:

(e) storing the integrated circuit design in a computer data file; and (f) manufacturing a plurality of integrated circuits in accordance with the integrated circuit design stored in the computer data file.

17. A data processing system comprising:

a processor;

a processor bus operably coupled to the processor; and memory operably coupled to the processor bus for storing data and instructions, wherein the memory stores instructions for:

receiving a plurality of cell types, wherein each cell type within the plurality of cell types includes a plurality of cell structures of varying heights, where the plurality of cell types are at least partially used in an integrated circuit design;

receiving a plurality of weighting values for the integrated circuit design, wherein each weighting value indicates a frequency of use of a respective cell type within the integrated circuit design; and processing through a plurality of different heights using the plurality of cell structures and the plurality of weighting values to determine a standard cell height for the integrated circuit design, wherein based on the standard cell height, an area of the integrated circuit design is optimized.

18. A data processing system comprising:

a processor;

a processor bus operably coupled to the processor; and memory operably coupled to the processor bus for storing data and instructions, wherein the memory stores instructions for:

receiving a plurality of cell types, wherein each cell type within the plurality of cell types includes a plurality of cell structures at least partially used in an integrated circuit design;

receiving a plurality of weighting values for the integrated circuit design, wherein each weighting value indicates a frequency of use of a respective cell type;

selecting a target cell height;

for each cell type, selecting a cell structure having a height equal to or less than the target cell height and a minimum width; and determining a respective integrated circuit design area based on selected cell structures and the plurality of weighting values to produce an optimized integrated circuit design area.

19. A data processing system for optimizing an integrated circuit design, the data processing system comprising:

a processor;

a processor bus operably coupled to the processor; and memory operably coupled to the processor bus for storing data and instructions, wherein the memory stores instructions for:

selecting a standard cell library height based on the integrated circuit design and expected intercell connection densities, wherein the standard cell library height satisfies cell routing requirements;

creating a physical design file using a place and route tool in conjunction with the standard cell library height and the integrated circuit design, wherein the physical design file includes physical placement of circuit elements and interconnections between standard cells;

determining expected intercell connection densities based upon the physical design file; and determining a standard cell library height which minimizes the area of the integrated circuit.

20. A design optimizer stored via computer readable medium, wherein the design optimizer comprises:

(a) a first plurality of computer instructions for receiving a plurality of cell types, wherein each cell type within the plurality of cell types includes a plurality of cell structures having different cell heights;

(b) a second plurality of computer instructions for receiving a plurality of weighting values for an integrated circuit design, wherein each weighting value indicates a frequency of use of a respective cell type in the integrated circuit design; and (c) a third plurality of computer instructions for processing different cell heights using the plurality of cell structures and the plurality of weighting values to generate a standard cell height, wherein optimizes an area of the integrated circuit design.

21. A method for making an integrated circuit, the method comprising the steps of:

(a) receiving a circuit description of an integrated circuit design, wherein the circuit description includes logic functions that may be performed by a plurality of physical cell structures;

(b) receiving a plurality of cell types, wherein each cell type within the plurality of cell types includes a plurality of cell structures;

receiving a plurality of weighting values for the integrated circuit design, wherein each weighting value indicates a frequency of use of a respective cell type;

(d) processing the plurality of cell structures and the plurality of weighting values to generate a standard cell height, wherein based on the standard cell height, an area of the integrated circuit is optimized;

(e) creating a physical design file using a place and route tool in conjunction with a plurality of physical cell structures from a standard cell library conforming to the standard cell height and the integrated circuit design, the place and route tool arranging physical cell structures into a two-dimensional substrate area to form a physical design file of an integrated circuit die; and (f) manufacturing the integrated circuit die onto one or more physical substrates.

22. A design optimizer stored via computer readable medium, wherein the computer readable medium comprises:

(a) means for receiving a plurality of cell types, wherein each cell type within the plurality of cell types includes a plurality of cell structures;

(b) means for receiving a plurality of weighting values for an integrated circuit design, wherein each weighting value indicates a frequency of use of a respective cell type;

(c) means for selecting a target cell height;

(d) means for selecting a cell structure for each cell type, the cell structure having a height equal to or less than the target cell height and a minimum width;

(e) means for determining a respective integrated circuit design area based on selected cell structures and the plurality of weighting values; and (f) means for repeating steps (c) through (e) for differing target cell heights to determine a cell height that produces an optimized integrated circuit design area.

23. A computer readable medium, wherein the computer readable medium includes instructions for:

(a) selecting a standard cell library height based on an integrated circuit design and expected intercell connection densities of the integrated circuit design, wherein the standard cell library height satisfies cell routing requirements;

(b) creating a physical design file using a place and route tool in conjunction with the standard cell library height and the integrated circuit design, wherein the physical design file includes physical placement of circuit elements and interconnections between standard cells;

(c) determining expected intercell connection densities based upon the physical design file; and (d) repeating steps (a) through (c) until the area of the integrated circuit is minimized.

* * * * *

UNITED STATES PATENT AND TRADEMARK OFFICE
CERTIFICATE OF CORRECTION

PATENT NO. : 5,737,236
DATED : April 7, 1998
INVENTOR(S) : Robert Maziasz et al.

It is certified that error appears in the above-identified patent and that said Letters Patent is hereby corrected as shown below:

In claim 20, column 17, line 39, after "wherein", insert - -the standard cell height- -.

Signed and Sealed this

Seventeenth Day of November, 1998

Attest:

BRUCE LEHMAN

Attesting Officer   Commissioner of Patents and Trademarks